United States Patent
Chow et al.

[11] Patent Number: 6,060,922
[45] Date of Patent: May 9, 2000

[54] DUTY CYCLE CONTROL BUFFER CIRCUIT WITH SELECTIVE FREQUENCY DIVIDING FUNCTION

[75] Inventors: Hwang-Cherng Chow, Chutung; Chi-Chang Shuai; Yuan-Hua Chu, both of Taipei, all of Taiwan

[73] Assignees: Industrial Technology Research Institute, Chutung; Computer Communication Research Labs., Hsinchu, both of Taiwan

[21] Appl. No.: 09/026,842

[22] Filed: Feb. 20, 1998

[51] Int. Cl.$^7$ .................................................. H03K 3/017
[52] U.S. Cl. ........................... 327/175; 327/236; 327/244; 331/40; 331/177 R
[58] Field of Search ..................................... 327/172–176, 327/113–115, 345, 141, 146, 155, 231, 232, 236, 243, 244; 331/40, 175, 177 R

[56] References Cited

U.S. PATENT DOCUMENTS

| | | | |
|---|---|---|---|
| 3,952,236 | 4/1976 | Hoover | 318/139 |
| 4,479,216 | 10/1984 | Krambeck et al. | 714/814 |
| 5,061,907 | 10/1991 | Rasmussen | 331/57 |
| 5,081,428 | 1/1992 | Atriss et al. | 331/57 |

*Primary Examiner*—Kenneth B. Wells
*Assistant Examiner*—Minh Nguyen
*Attorney, Agent, or Firm*—Proskauer Rose LLP

[57] ABSTRACT

A duty cycle control buffer uses an edge detector input stage to detect the transitions of an unpredictable clock signal input. The edge detector generates one shot output signals in synchronism with the clock signal. A pulse width controllable monostable multivibrator converts the one shot signals into rectangular pulses, at the same frequency as the original clock input. The rectangular pulses are inverted and then averaged, to provide a voltage input to one side of an operational amplifier. A reference voltage is supplied to the other side of the operational amplifier, such that the difference between the average voltage and the reference voltage generates an output control voltage from the operational amplifier. This control voltage provides negative feedback to a pulse width control stage within the monostable multivibrator, thereby adjusting the pulse width of the rectangular pulse output until a steady state is reached. A frequency divider circuit may be inserted in front of the edge detector to add a selective frequency dividing capability to the duty cycle control buffer.

14 Claims, 13 Drawing Sheets

DUTY CYCLE CONTROL BUFFER CIRCUIT WITH SELECTIVE FREQUENCY DIVIDING FUNCTION

RELATED APPLICATION

This invention is related to U.S. patent application Ser. No. 09/026,843, entitled "FREQUENCY MULTIPLICATION CIRCUIT AND METHOD", filed on even date herewith for Hwang-Cherng Chow et al. The contents of the above-noted application is incorporated herein by reference.

FIELD OF THE INVENTION

The present invention relates generally to CMOS integrated circuits. More particularly, the present invention relates to a CMOS integrated circuit for adjusting the duty cycle of clock signals, with the additional capability of selective frequency dividing.

BACKGROUND OF THE INVENTION

A number of parameters may be used to describe the characteristics of an electrical signal. These parameters include voltage amplitude, frequency, period, duty cycle, on-time and off-time. Duty cycle is particularly relevant to signals having a digital or rectangular waveform. Digital or rectangular waveforms typically alternate between a low voltage level and a high voltage level, with the transition between voltage levels occurring substantially instantaneously. The term "period" refers to the duration of a single cycle. For each cycle, a digital or rectangular waveform remains at the low voltage level for a portion of the period, and at the high voltage level for the remainder of the period. "On time" refers to the amount of time a digital or rectangular waveform remains at the high voltage level, while "off-time" refers to the amount of time a digital or rectangular waveform remains at the low voltage level. "Duty cycle" refers to the ratio of on time to period, and is often specified as a percentage. A digital or rectangular waveform signal may have a duty cycle ranging from zero to 100 percent. In some cases, the duty cycle of a signal may be unpredictable. To make the characteristics of this type of signal more predictable, it is often desirable to adjust the duty cycle of the unpredictable signal to a known value, such as 50 percent. A 50 percent duty cycle provides equal on time and off time for each period.

In the prior art, methods for controlling the duty cycle of an input signal have been reported. For example, a known way to adjust an input signal to a 50 percent duty cycle output signal is through the use of a phase locked loop (PLL). As shown in FIG. 1, the incoming clock frequency (f) is first doubled to 2f by the PLL voltage controlled oscillator (VCO), and is then divided with a 2:1 divider, such as a D flip-flop, to provide a 50% duty cycle output signal, as well as a 50% duty cycle feedback signal to the PLL phase detector. There are two disadvantages to this type of duty cycle control, however, as described below:

(1) power consumption is increased due to the PLL circuit operating at twice the frequency; and (2) a complex analog design of the VCO is required, which is expensive, both in terms of implementation costs, and integrated circuit "real estate".

Another prior art method for controlling the duty cycle of a signal is described in U.S. Pat. No. 4,479,216, issued to Krambeck, et al. Krambeck describes a circuit, as shown in FIG. 2, in which the average voltage (V+) of a clock out pulse (at node t7) is compared to a reference voltage (VDD/2) in an operational amplifier. The OPAMP output (Vfb) is fed back to transistors MP2 and MN1 to alter the timing of the clock pulses inputted to pullup transistor MP1 and pulldown transistor MN2, thereby controlling the rise time and fall time of the output pulse at node t2. Since the operating frequency of the entire circuit is the same as that of the input clock signal, this circuit consumes less power than the frequency doubling PLL prior art described above. However, this circuit does tend to have a loop stability problem under certain conditions. For example, the duty cycle of an unpredictable input clock signal may vary from 20 percent to 80 percent. Although the duty cycle may change, its frequency remains the same. Therefore, for a pre-determined operating frequency, the time constant of the RC low pass filter (integrating circuit) remains the same. As a result, when an input clock signal has a duty cycle greater than 50 percent, the disclosed circuit tends to have an unstable loop function. The instability occurs because the NMOS transistor of the input stage (MN2) may be turned on for a longer time period than the feedback signal Vfb is able to control via transistor MN1.

Accordingly, it is an object of the present invention to provide an improved method and circuit for adjusting the duty cycle of a clock signal, which overcomes the main disadvantages of the prior art; namely: (1) to consume less power than the frequency doubling PLL approach; and (2) to provide a stable loop function regardless of the duty cycle of the input signal.

SUMMARY OF THE INVENTION

In accordance with an illustrative embodiment of the present invention, a duty cycle control buffer is configured to include an edge detector, a monostable multivibrator with pulse width control, an inverter, an integrator, an operational amplifier, and a feedback loop to the pulse width control circuit. An unpredictable clock signal is inputted to the edge detector, which generates a one shot output signal for each transition cycle of the input clock signal. The one shot signal is converted into a pulse width controlled rectangular clock signal by the monostable multivibrator, and then inverted by the inverter. This inversion causes the duty cycle of the rectangular clock signal to be inverted, or complemented. The inverted output is then integrated to derive an average voltage of the inverted rectangular clock signal. The resultant average voltage is inputted to one side of an operational amplifier, where it is compared to a reference voltage inputted to the other side of the operational amplifier. The reference voltage is preset to a desired duty cycle value; e.g., a reference voltage equal to the supply voltage VDD divided by 2 (VDD/2) results in an adjusted duty cycle of 50%.

The differential output of the operational amplifier is used as a negative feedback control signal to the pulse width control circuit within the monostable multivibrator. Thus, if the duty cycle of the input clock is greater than desired, the feedback control signal will cause the pulse width (and duty cycle) to decrease until it reaches a steady state value, as determined by the reference voltage. Conversely, if the duty cycle of the input clock is less than desired, the feedback control signal will cause the pulse width (and duty cycle) to increase until it reaches a steady state value, as determined by the reference voltage. Moreover, due to the action of the edge detector, the feedback loop stability of the inventive circuit is not affected by the pulse width/duty cycle of the input clock signal.

A selective frequency divider circuit may be combined with the inventive duty cycle control buffer to provide an efficient circuit for both frequency division and duty cycle control. In this case, the frequency divider would process an input clock signal prior to its being transition detected by the edge detector. The single shot output of the edge detector would then be duty cycle controlled, as described above, at the processed frequency.

Illustrative embodiments of the present invention are more fully described below in conjunction with the following drawings.

DETAILED DESCRIPTION OF THE INVENTION

Figure 3:
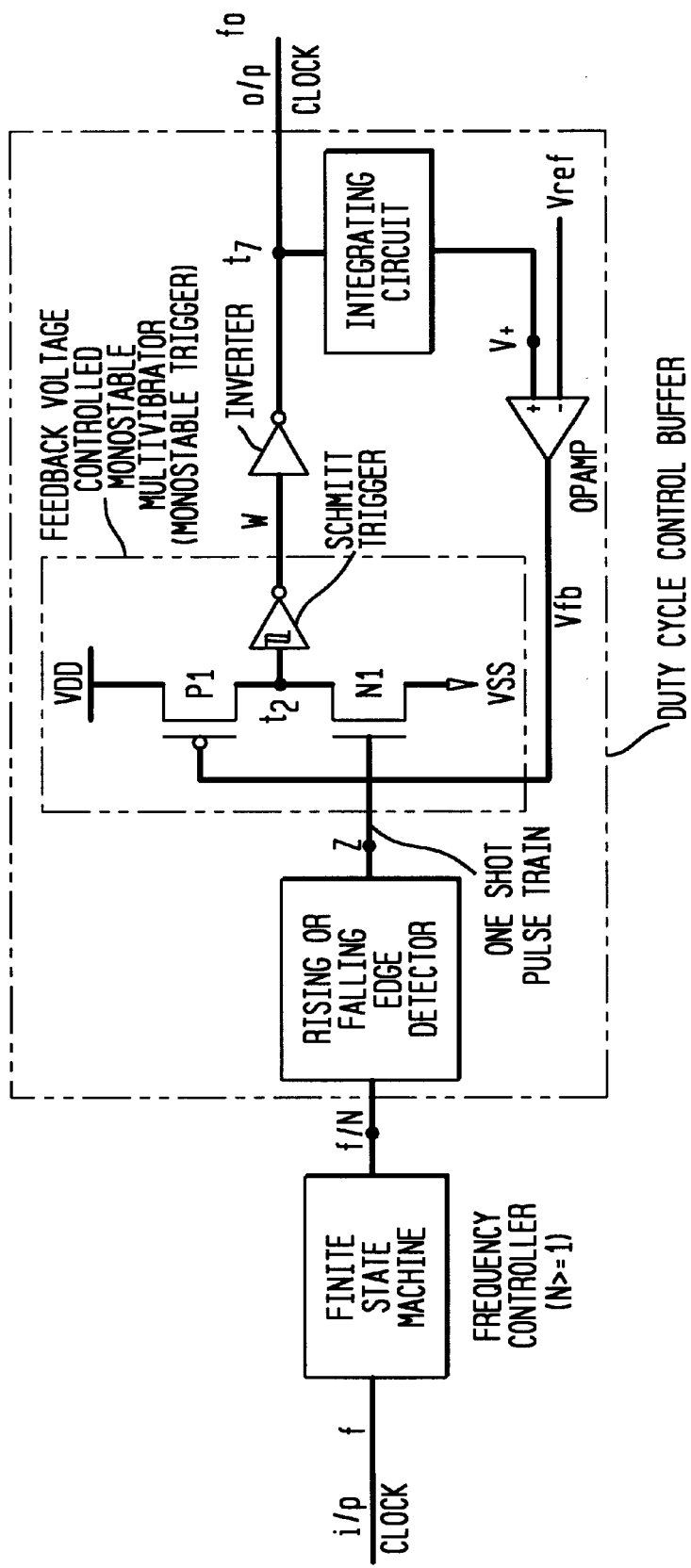
FIG. 3 is a first preferred embodiment of a duty cycle control buffer with a selective frequency dividing function, in accordance with the present invention.

FIG. 3 shows a first embodiment of a duty cycle control buffer circuit with a selective frequency dividing function, in accordance with the present invention. The basic operation of each functional block within FIG. 3 is summarized below:

(1) Finite State Machine

This functional block is a frequency controller. That is, the finite state machine operates on the frequency (f) of the input clock signal by outputting only one clock pulse for N input clock pulses, where N>=1. Therefore, the frequency of the clock signal out of the finite state machine is equal to f/N.

(2) Rising or Falling Edge Detector

This functional block is either a rising edge detector or a falling edge detector, which detects the transition edge of the finite state machine output clock signal f/N, and in turn generates a one shot pulse train output (Z). Importantly, the one shot output pulse train is at the same frequency as the output of the finite state machine f/N, but the one shot pulse train duty cycle is much less than 50%. This function can be implemented with a simple NOR gate (or NAND gate) and associated delay elements.

(3) Feedback Voltage Controlled Monostable Multivibrator (Monostable Trigger)

This functional block generates an output signal W whenever it is triggered by the one shot pulse input (Z). The pulse width of the outputted signal W is controlled by the feedback voltage Vfb, in conjunction with PMOS P1 and the Schmitt trigger circuit. Alternately, an inverter can be used in place of the Schmitt trigger.

(4) Inverter

This functional block inverts the monostable output signal (W) in order to output a clock signal $f_0$ (at node t7) whose duty cycle is the complement of the duty cycle of monostable output signal W.

(5) Integrating Circuit

This functional block integrates the final output clock signal $f_0$ at node t7, and outputs the average voltage (V+) of this integrated signal to the positive input of the operational amplifier (OPAMP). For the final output clock signal $f_0$ to operate at a 50 percent duty cycle, the average voltage V+ must equal VDD/2.

(6) OPAMP

This functional block may be a high gain operational amplifier or differential amplifier, with the negative input receiving a predetermined reference voltage (Vref). The output of this OPAMP is a control voltage (Vfb), proportional to the difference between V+ and Vref, which is fed back to the monostable trigger circuit to adjust the turn-on strength of PMOS P1. For a duty cycle of 50%, Vref is set equal to VDD/2.

The above described functional blocks 2, 3, 4 and 5 comprise a duty cycle control buffer circuit, in accordance with the present invention. In brief, this duty cycle control buffer automatically adjusts the duty cycle of an input clock signal via a closed loop function. The desired duty cycle value is determined by the reference voltage Vref. The operating characteristics of the inventive duty cycle control buffer are more fully described below.

Two examples will be used to illustrate the operation of the duty cycle control buffer: (1) the duty cycle is greater than desired, and (2) the duty cycle is less than desired.

(1) If the duty cycle is greater than desired, the average voltage (V+) derived from the output clock signal $f_0$ by the integrating circuit will be larger than the reference voltage Vref. When the average voltage V+ from the integrating circuit is larger than Vref, the OPAMP will output a feedback control voltage (Vfb) with increased amplitude. The increase in Vfb at the gate of PMOS P1 will have the effect of decreasing the turn-on strength of PMOS P1. Therefore, the voltage level at node t2 will be pulled up to VDD more slowly. As a result, the output signal W from the monostable trigger circuit will have an increased pulse width. This signal (W) is then inverted, so that the resultant output signal ($f_0$) at node t7 has a narrowed pulse width. Therefore, the average voltage V+, which is derived from the output clock signal $f_0$ by the integrating circuit, will decrease until the desired duty cycle is achieved (steady-state), as determined by the value of the reference voltage Vref.

(2) If the duty cycle is less than desired, the average voltage V+ derived from the output clock signal $f_0$ by the integrating circuit will be less than the reference voltage Vref. When the average voltage V+ from the integrating circuit is less than Vref, the output control voltage Vfb will decrease in amplitude. This will have the effect of increasing the turn-on strength of PMOS P1. Therefore, the voltage level at node t2 will be pulled up to VDD more quickly. As a result, the output signal W from the monostable trigger circuit will have a decreased pulse width. Output signal W is then complemented by the inverter, such that the resultant output signal ($f_o$) at node t7 has an increased pulse width. Thus, the average voltage V+, which is derived from the output clock signal $f_0$ by the integrating circuit, will increase until the desired duty cycle is achieved (steady-state), as determined by the value of the reference voltage Vref.

Since the inventive duty cycle control buffer utilizes a closed loop with negative feedback, the loop function will be stable under steady-state conditions. When the closed loop reaches its steady-state condition, the duty cycle will be equivalent to the value predetermined by Vref.

Figure 4A:
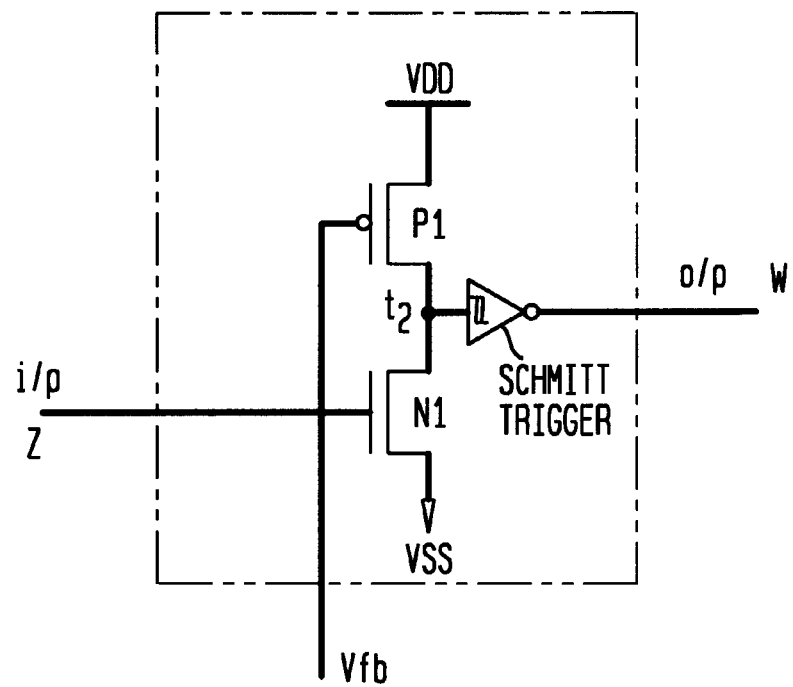
FIG. 4a is a first TYPE I monostable circuit.

As shown in FIG. 3, the monostable trigger circuit within the inventive duty cycle control buffer receives one shot pulse train signals (Z) from the rising or falling edge detector. This type of monostable trigger is classified as a TYPE I circuit, and is shown again in FIG. 4*a*.

Figure 4B:
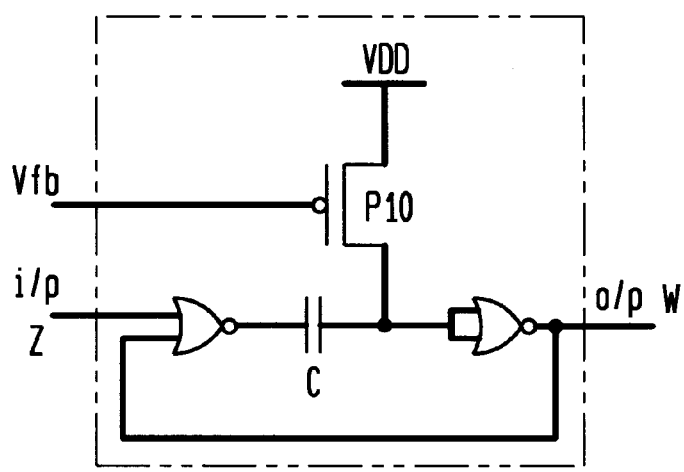
FIG. 4b is a second TYPE I monostable circuit.

Another preferred embodiment of a TYPE I monostable trigger circuit is shown in FIG. 4*b*. As in FIG. 4*a*, a positive-going input clock signal is pulse width adjusted by the action of feedback signal Vfb, in conjunction with PMOS P10 and the NOR gates.

Figure 5:
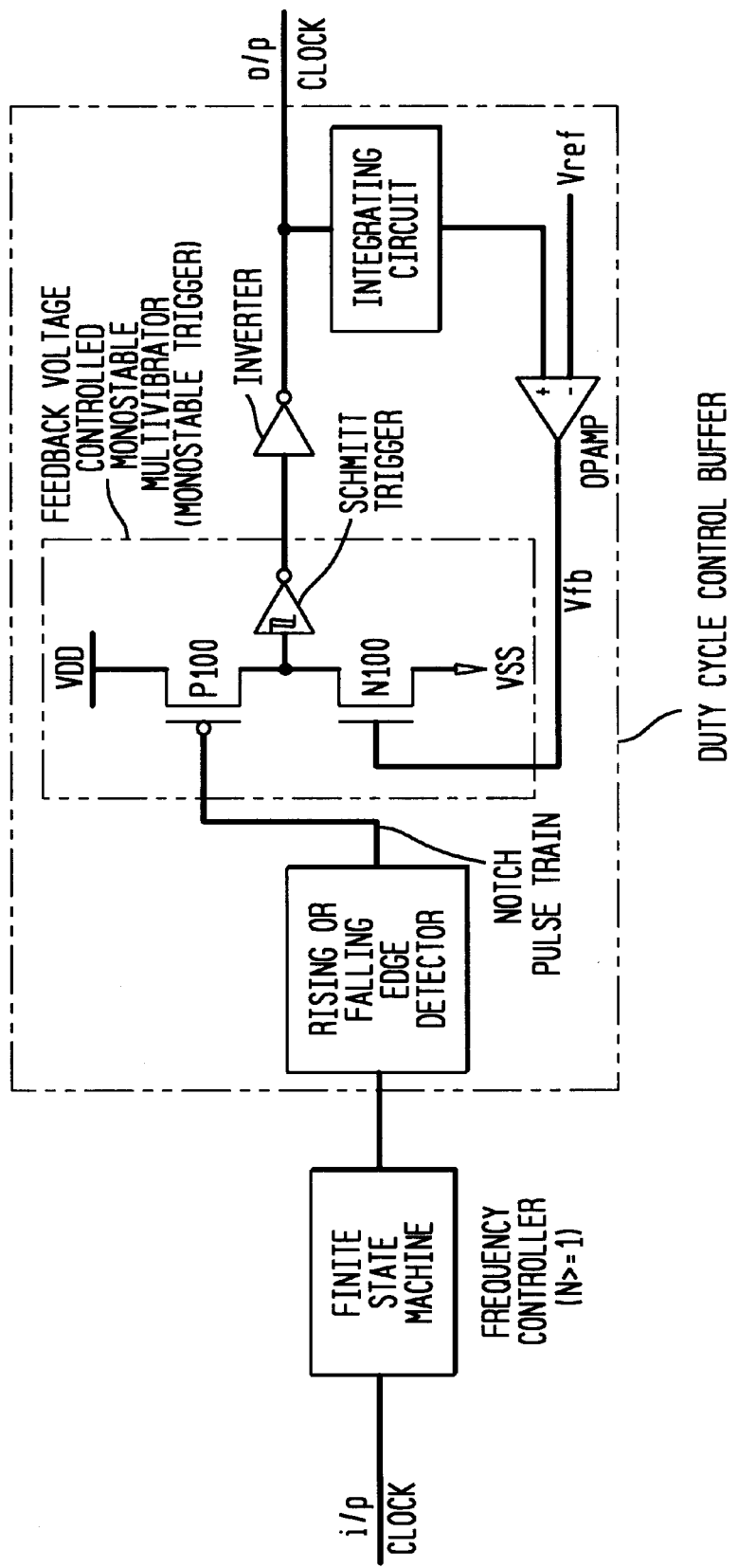
FIG. 5 is a second preferred embodiment of a duty cycle control buffer with a selective frequency dividing function, in accordance with the present invention.
Figure 6A:
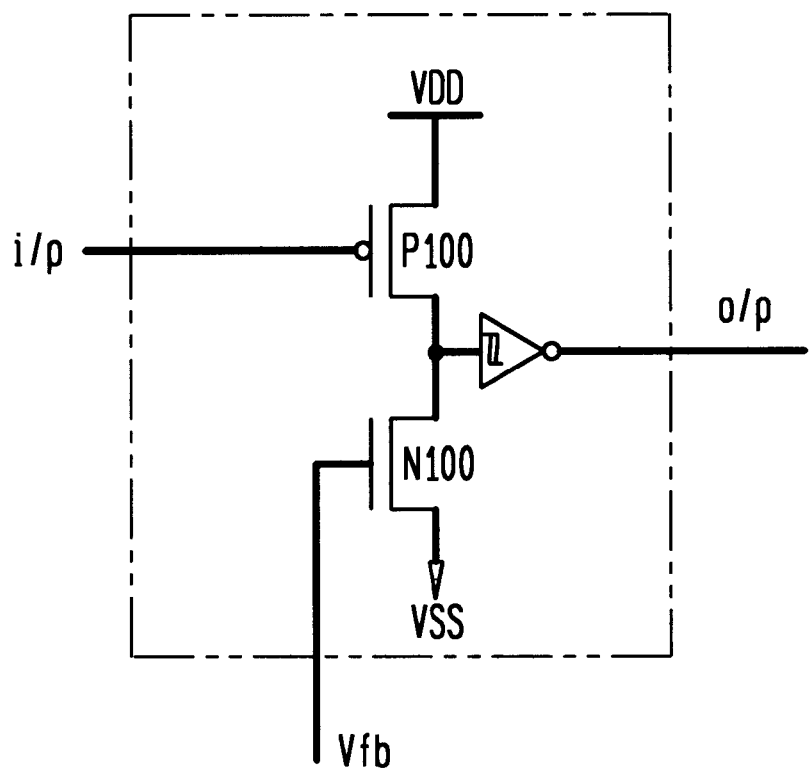
FIG. 6a is a first TYPE II monostable circuit.
Figure 6B:
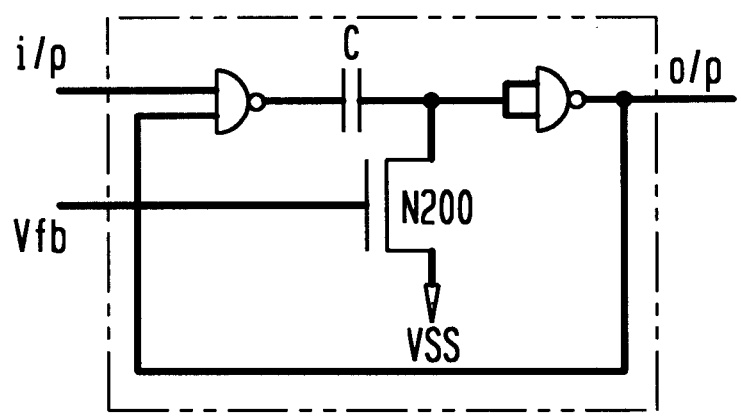
FIG. 6b is a second TYPE II monostable circuit.

A second type of monostable trigger circuit can also be used within the inventive duty cycle control buffer, as illustrated in FIG. 5. In this circuit, the monostable trigger input receives notch-like, or negative-going, pulse train signals from the rising or falling edge detector. Therefore, the notch pulse train is inputted to PMOS P100, and the feedback voltage Vfb is inputted to NMOS N100. Otherwise, the circuit operation is exactly the same as described above for FIG. 3. This type of monostable trigger is classified as a TYPE II circuit, and is shown again in FIG. 6*a*. Moreover, another preferred embodiment of a TYPE II monostable trigger circuit is shown in FIG. 6*b*. As in FIG. 6*a*, the feedback voltage Vfb, in conjunction with NMOS N200 and the NAND gates, controls the pulse width of the output signal.

Figure 7A:
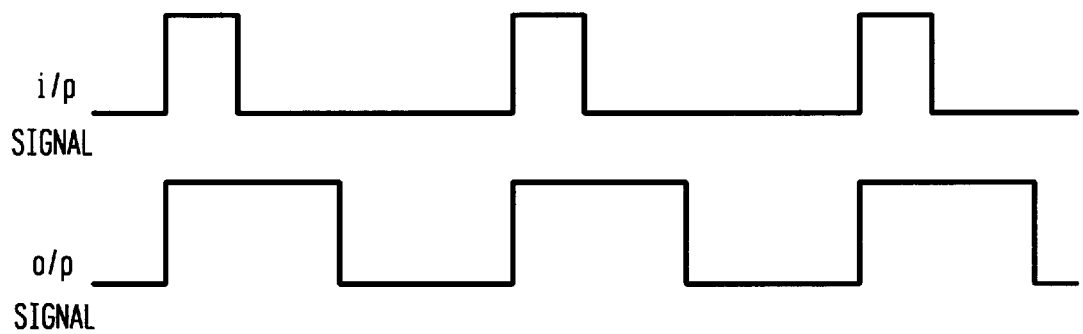
FIGS. 7a and 7b depict timing diagrams for both TYPE I (FIG. 7a) and TYPE II (FIG. 7b) monostable circuits.
Figure 7B:
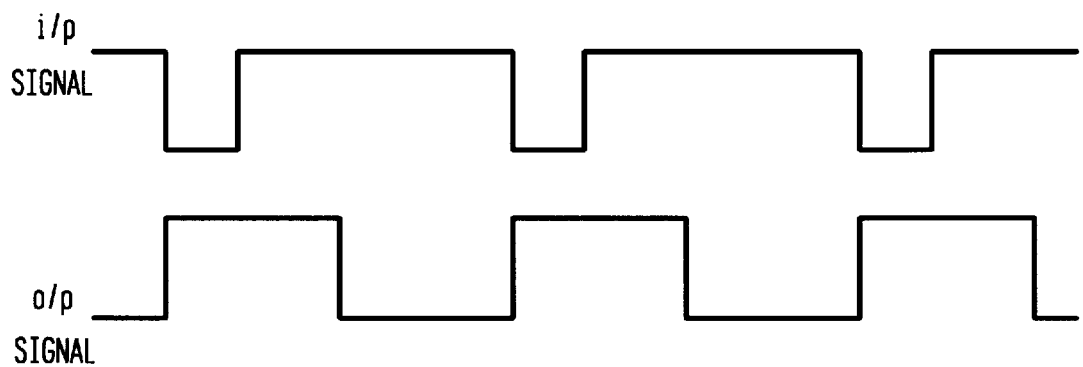

The basic input and output signal timing diagrams for TYPE I (positive-going input) and TYPE II (negative-going input) monostable trigger circuits are shown in FIGS. 7*a* and 7*b*, respectively. Both output signals represent a 50% duty cycle positive-going clock, derived from input signals which are less than 50% duty cycle, and are either positive-going (FIG. 7*a*) or negative-going (FIG. 7*b*).

In general, digital signal processing applications require a clock signal to be a symmetrical square wave, with a 50 percent duty cycle. In order to shape an incoming non-symmetrical clock signal into a symmetrical, 50 percent duty cycle square wave, the reference voltage Vref of the inventive duty cycle buffer (FIG. 3, etc.) must be set to a value equal to VDD/2.

Importantly, the disclosed duty cycle control buffer can also be used as a frequency divider when combined with a finite state machine (FIG. 3, etc.). By selecting a desired value of N, the finite state machine output signal will have a frequency equal to the input frequency f divided by N, or f/N. Therefore, the monostable trigger will also output a signal at the frequency f/N. In addition, if Vref is set equal to VDD/2, the output signal will be adjusted to a 50 percent duty cycle, as described above. Thus, the disclosed combination of duty cycle buffer and finite state machine can provide both frequency division and duty cycle adjustment.

The finite state machine is known in the art, and may be implemented in various forms. For example, a shift register implementation, or a binary counter implementation, is disclosed in pages 43 and 44 of "The design and analysis of VLSI circuits", by Lance A. Glasser and Daniel W. Dobberpuhl, Addison-Wesley publishing company, 1985. In an alternate embodiment, the finite state machine can be implemented with a modulo circuit and simple control logic. A modulo circuit design is described on pages 334–339 of "Digital integrated electronics", by Herbert Taub and Donald Schilling, McGRAW-HILL book company, 1983.

Figure 1:
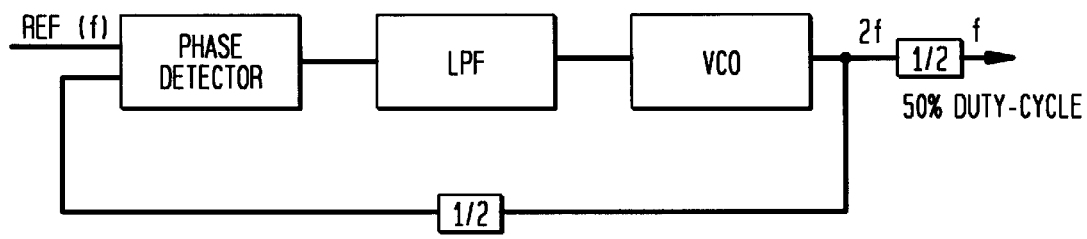
FIG. 1 is a prior art frequency doubling phase locked loop.
Figure 2:
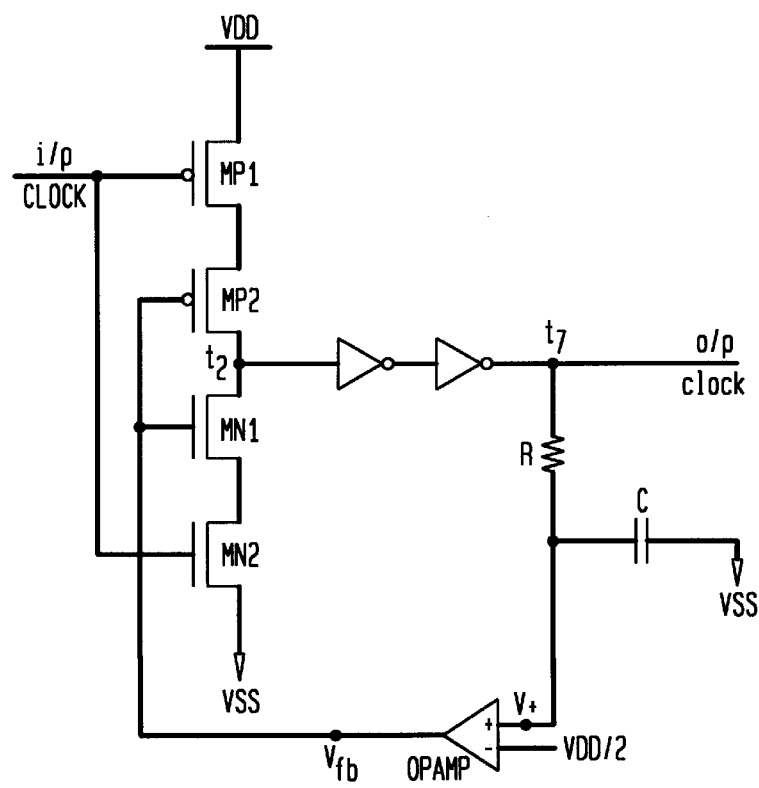
FIG. 2 is a prior art voltage comparison circuit.
Figure 8:
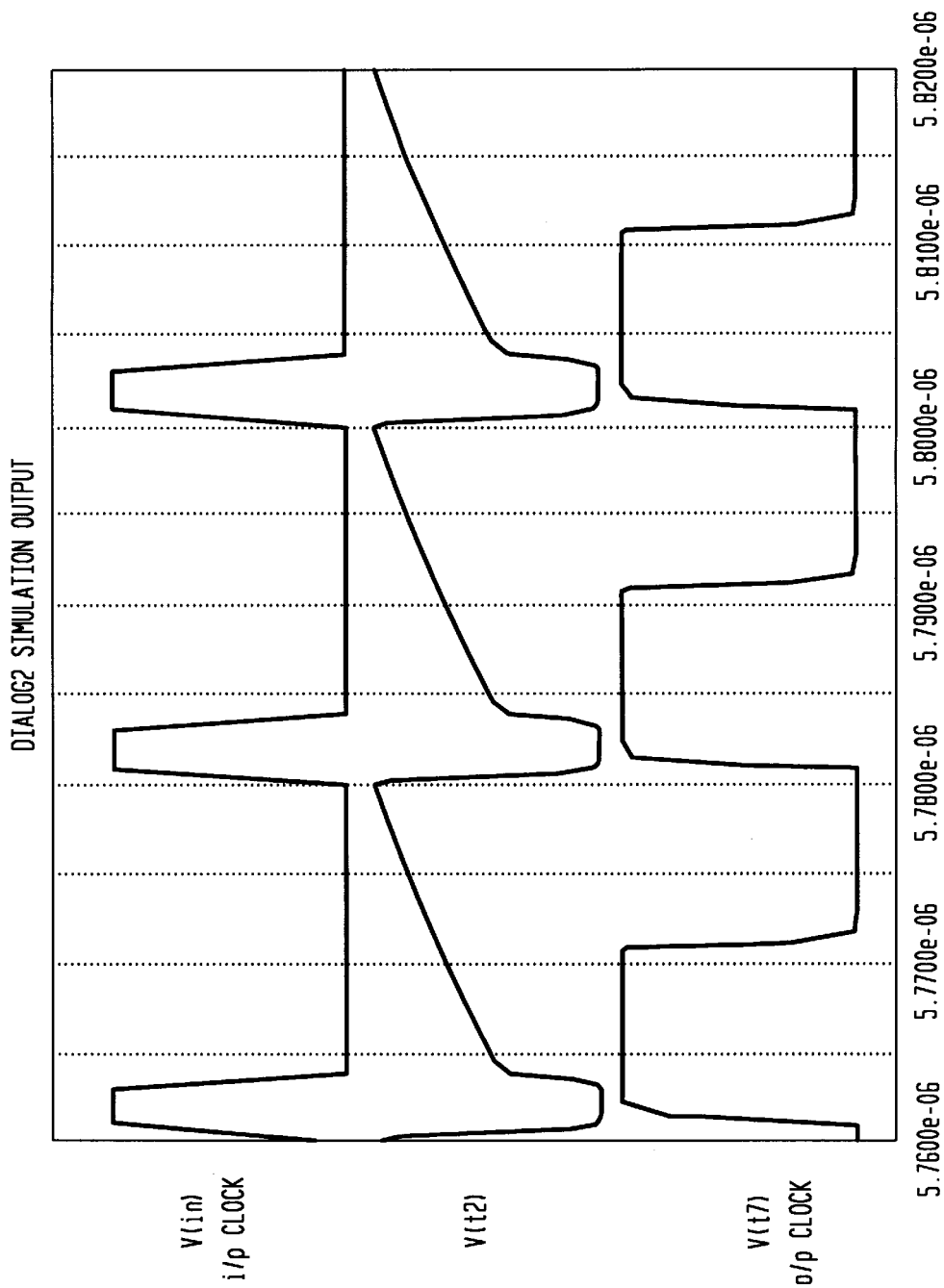
FIGS. 8 and 9 show simulation test results for a prior art circuit with a 50 MHz input clock, and 10 and 80 percent duty cycles, respectively. (N=1)
Figure 9:
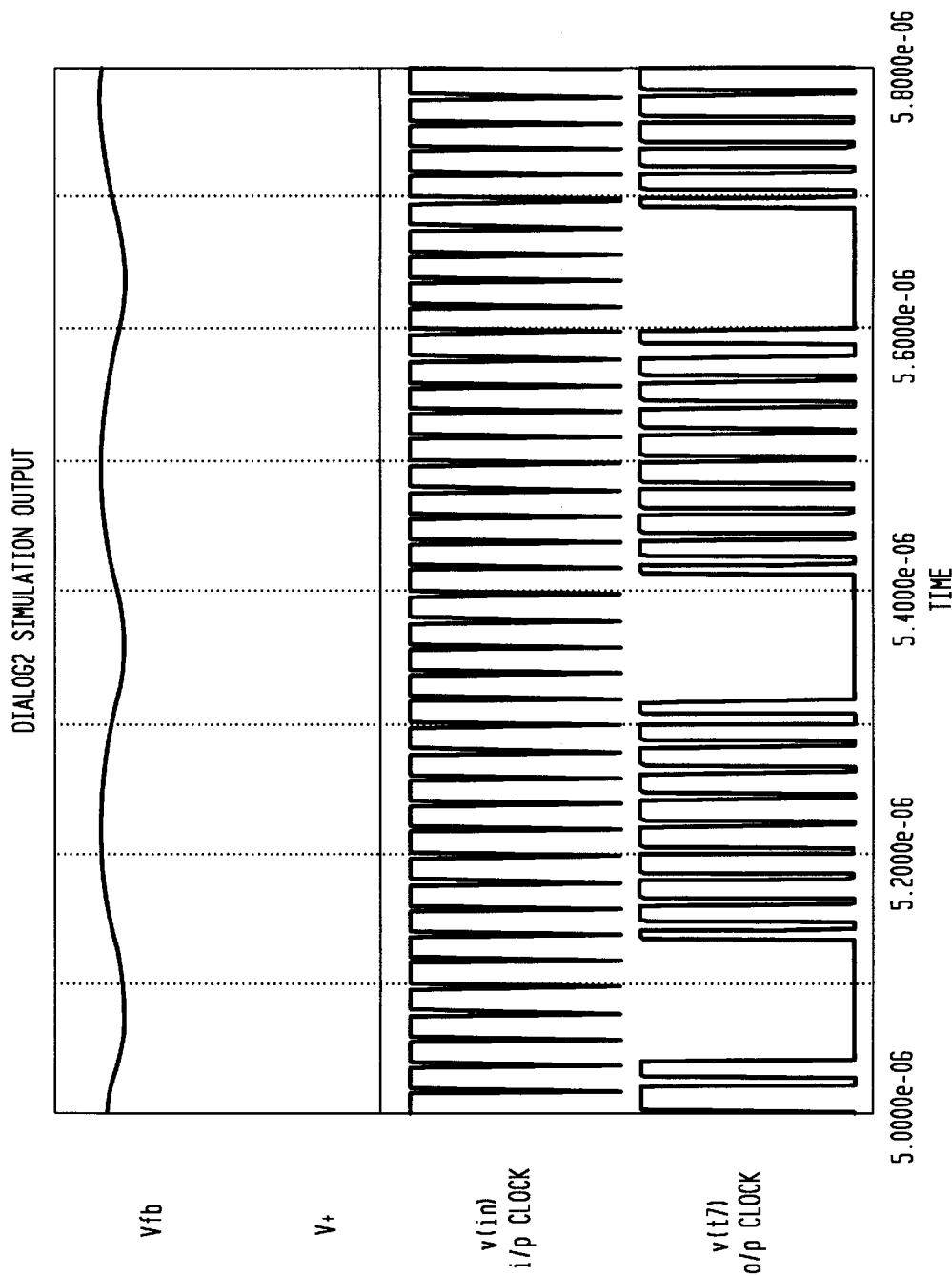

To illustrate the operational advantage of the present invention with respect to the prior art circuit of FIG. 2, a number of simulation tests were conducted. FIG. 8 shows simulation test results,for the prior art circuit (FIG. 2) using a 50 MHz input clock signal v(in) with a 10 percent duty cycle. FIG. 9 shows simulation test results for the prior art circuit (FIG. 2) using a 50 MHz input clock signal v(in) with an 80 percent duty cycle. While the output signal v(t7) in FIG. 8 is a proper representation of the input signal v(in), this is not the case in FIG. 9. Here, the 80 percent duty cycle input signal v(in) is incorrectly represented by the output signal v(t7) due to a loop stability problem. That is, despite the fact that the closed loop of the prior art circuit has reached a steady-state condition, the resultant clock output signal is periodically in error, as shown in FIG. 9.

Figure 10:
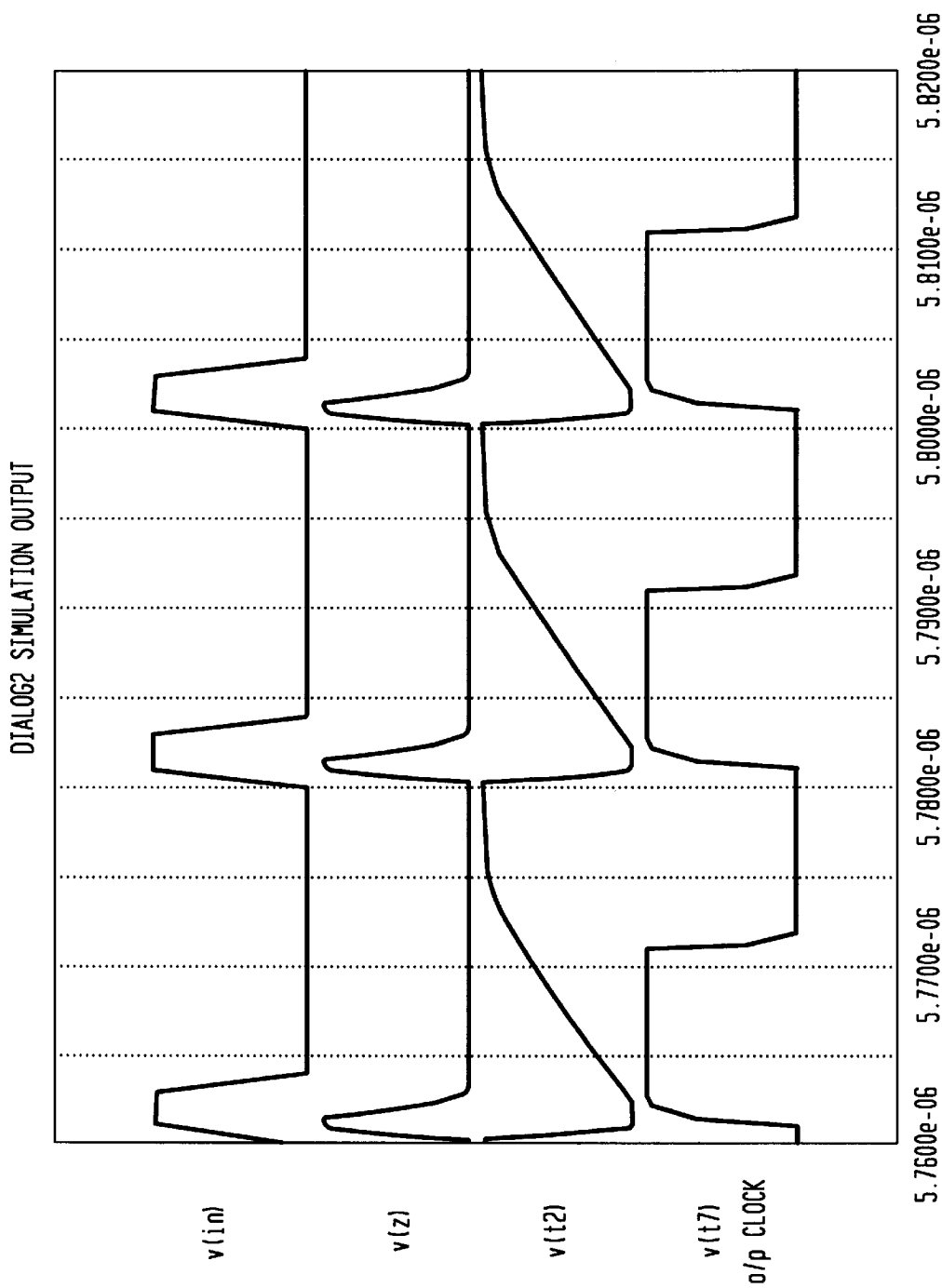
FIGS. 10 and 11 show simulation test results for the present invention with a 50 MHz input clock, and 10 and 80 percent duty cycles, respectively. (N=1)
Figure 11:
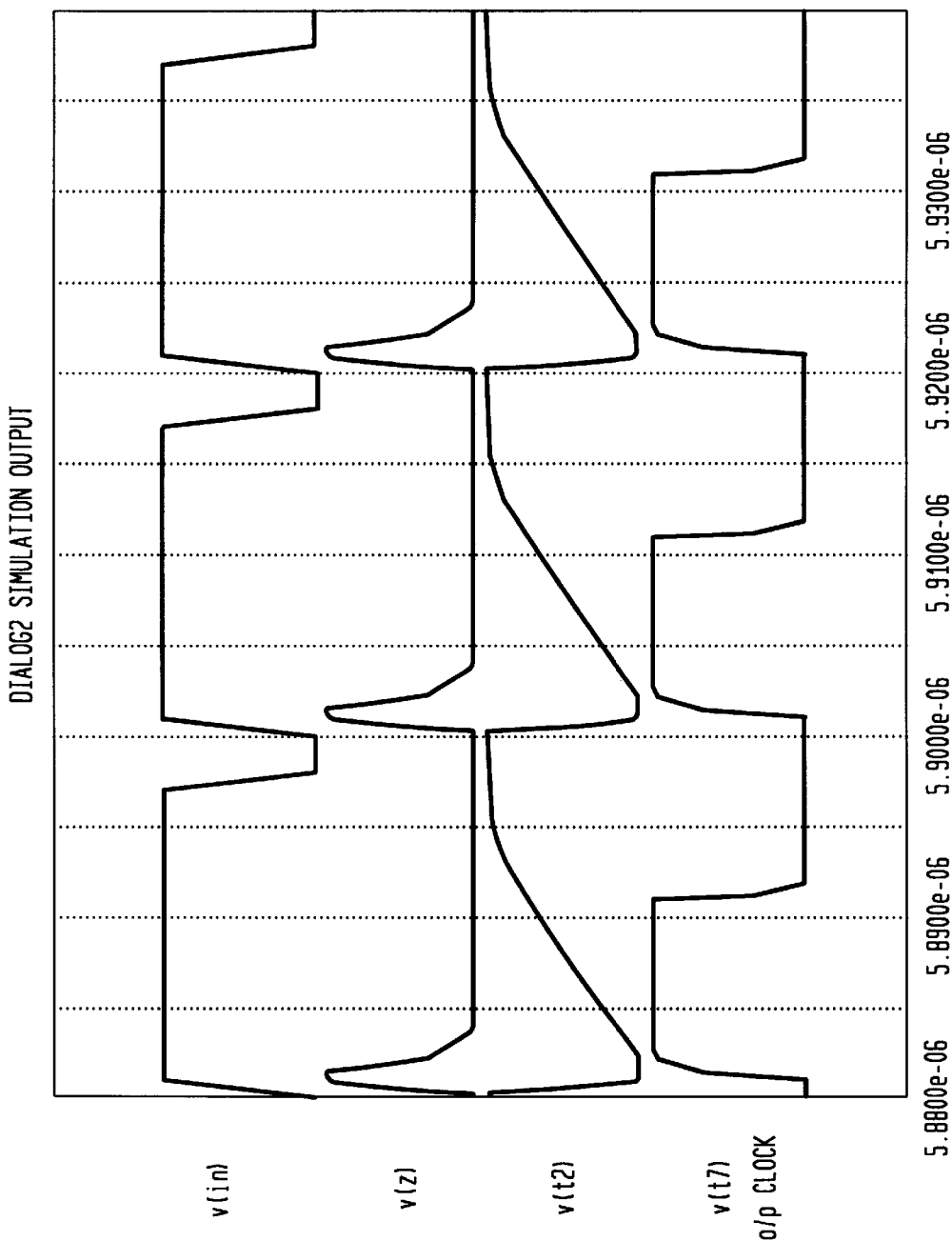

FIG. 10 shows simulation test results for the inventive circuit (FIG. 3) using a 50 MHz input clock signal with a 10 percent duty cycle, while FIG. 11 shows simulation test results for the inventive circuit using a 50 MHz input clock signal with an 80 percent duty cycle. In both cases, the output signal v(t7) correctly represents the frequency of the input signal v(in), demonstrating that the loop stability problem of the prior art has been eliminated in the present invention. This is due to the action of the rising or falling edge detector, which provides a one shot pulse train signal (Z in FIG.3, and v(Z) in FIGS. 10 and 11) to the monostable trigger circuit input without regard to the original duty cycle of the input signal (f/N).

Figure 12:
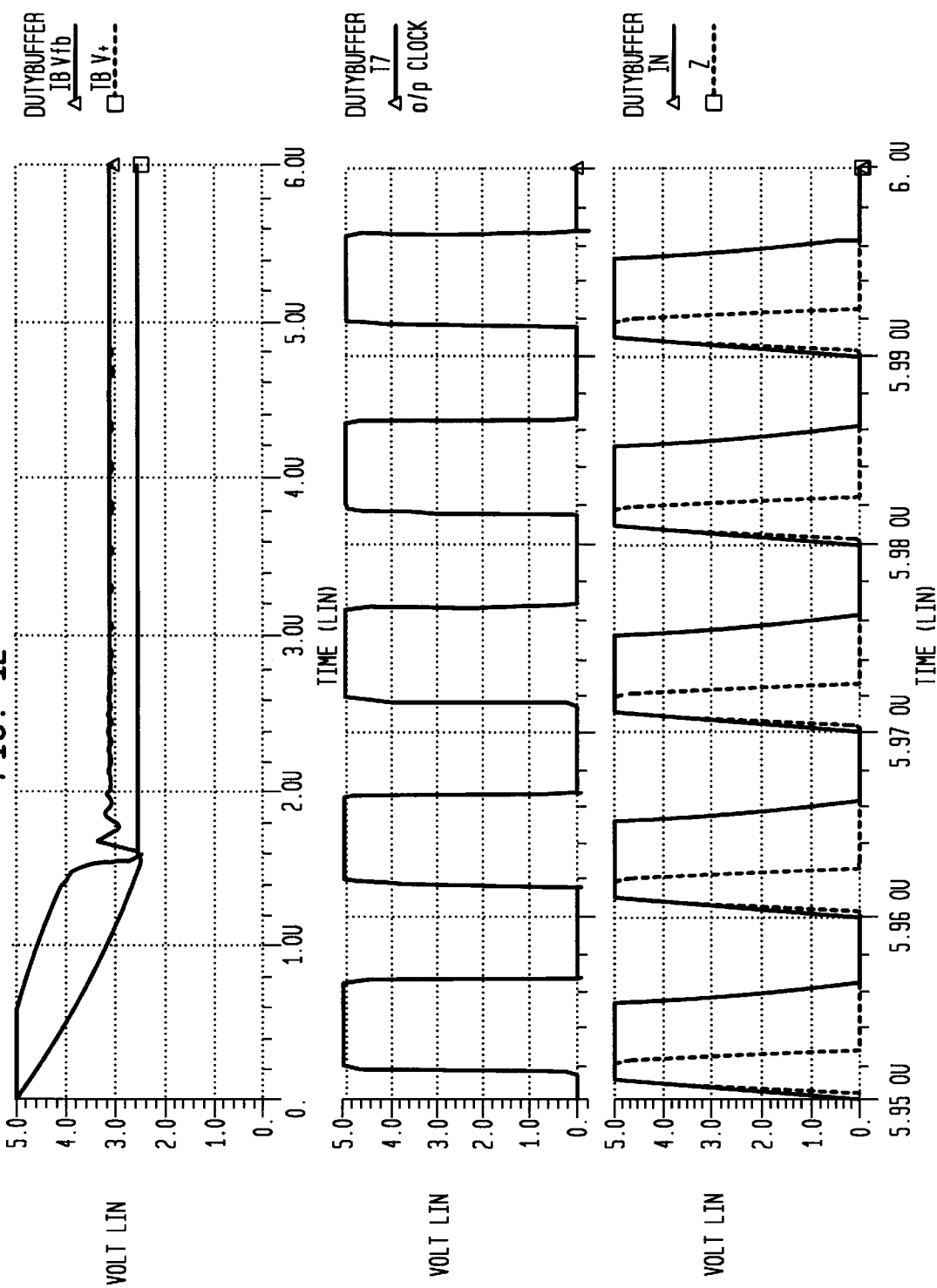
FIG. 12 shows a 50 percent duty cycle adjustment of a 100 MHz input clock (N=1), according to the present invention.

FIG. 12 shows simulation test results for the first TYPE I inventive duty cycle buffer (FIG. 4*a*), using a 100 MHz input clock and a Vref equal to VDD/2. As shown in FIG. 12, the output signal T7 is a correct representation of the input signal frequency, and it has a 50 percent duty cycle.

Figure 13:
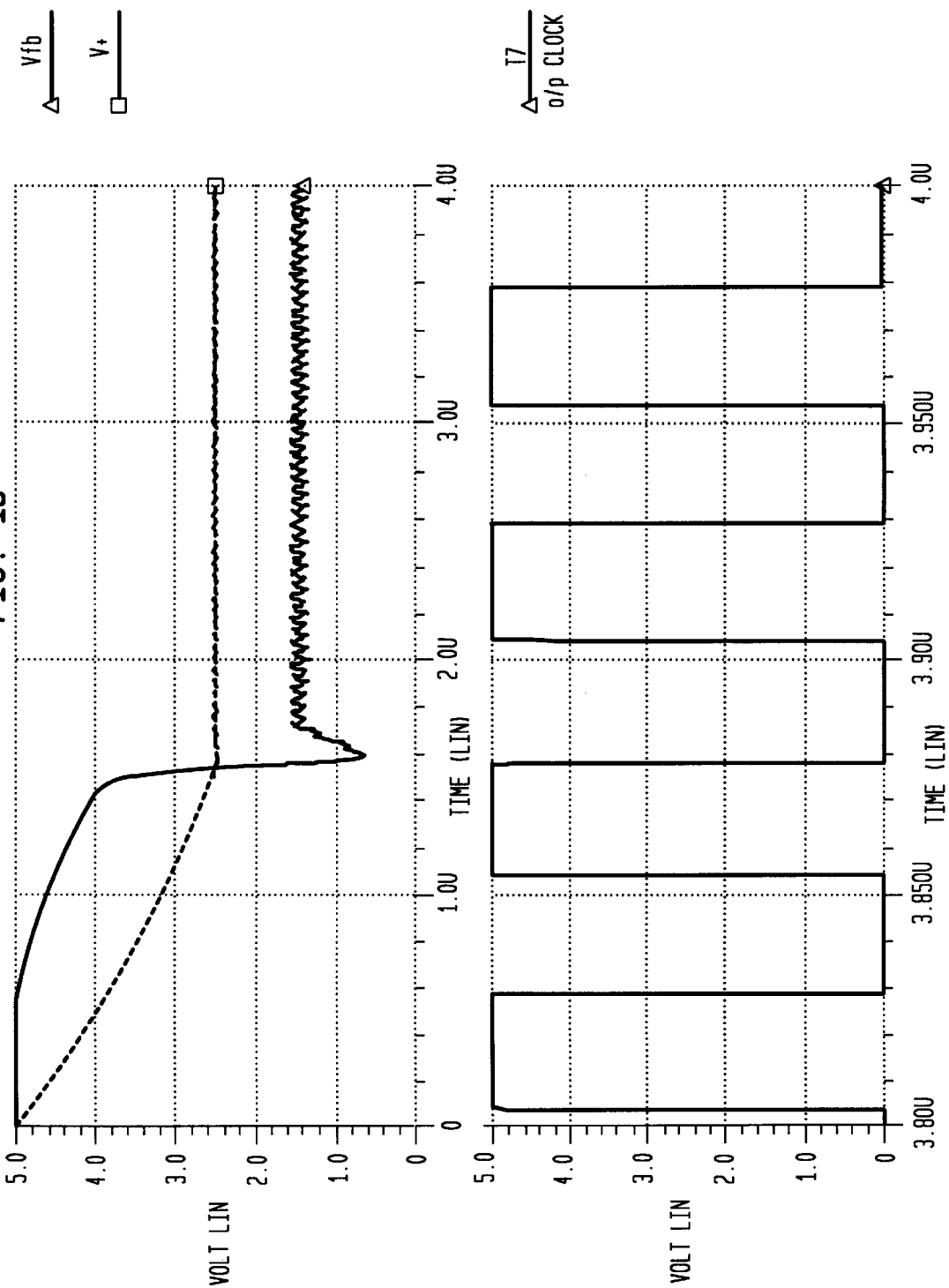
FIG. 13 shows a 50 percent duty cycle adjustment of a 20 MHz input clock using the second TYPE I monostable circuit (N=1), according to the present invention.

FIG. 13 shows simulation test results for the second TYPE I monostable circuit (FIG. 4*b*), using a 20 MHz input clock and a Vref equal to VDD/2.

Figure 14:
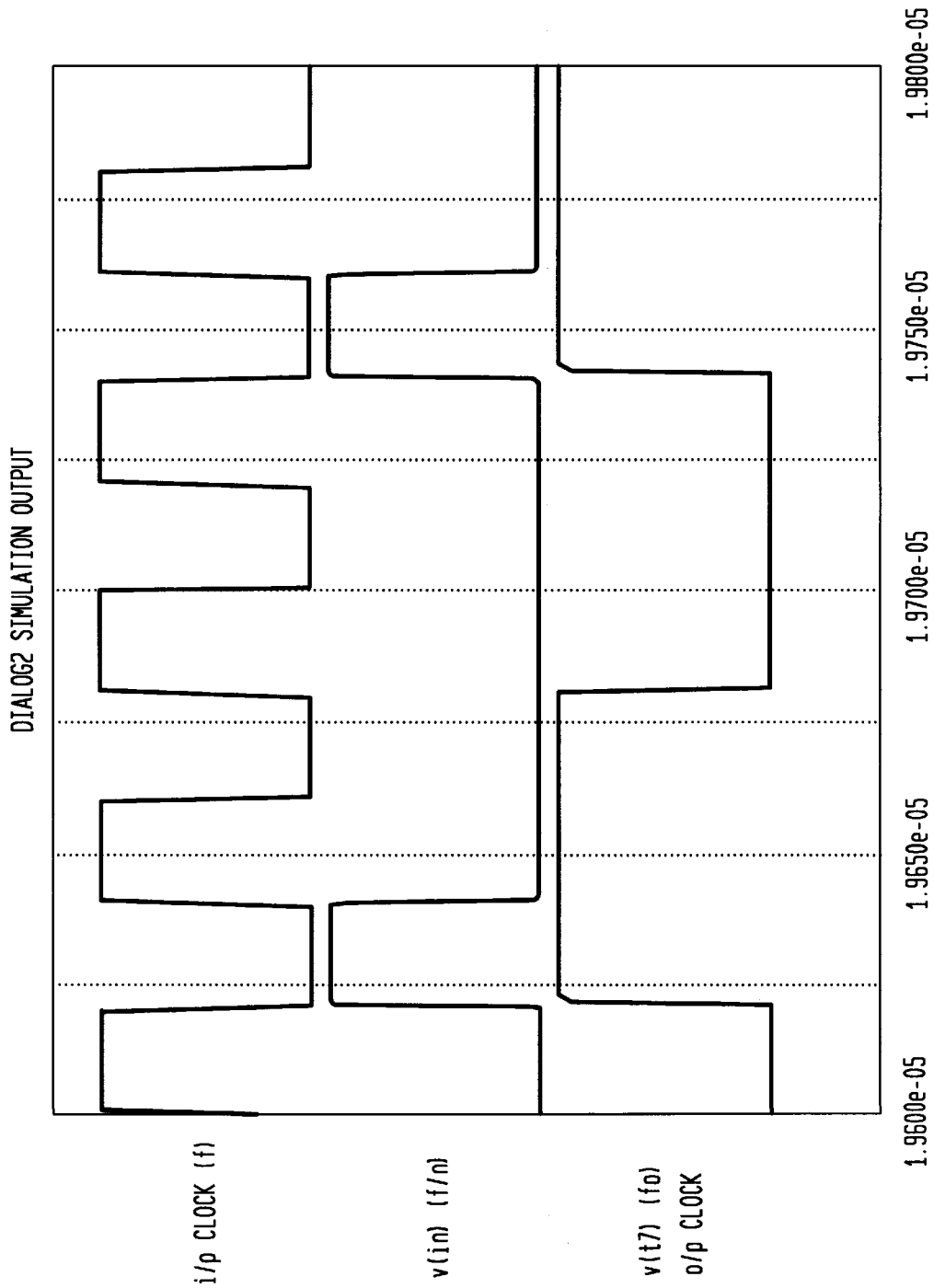
FIG. 14 shows the simulated operation of a 3:1 frequency divider (N=3) with a 50 percent duty cycle output, according to the present invention.

The simulation tests of FIGS. 12 and 13 were focused on the operation of a 50 percent duty cycle control buffer with a finite state machine N equal to 1. That is, the output signal frequency is equal to the input signal frequency. In FIG. 14, however, N is set to 3, so that the finite state machine acts as a 3:1 divider on the input signal. The 50 percent duty cycle adjustment is then applied by the duty cycle buffer, as described above. As a result, the inventive combination of finite state machine and duty cycle buffer provides both a frequency division function and also a pulse width adjustment function to a 50 percent duty cycle output.

In short, a circuit for adjusting and controlling a clock signal with an unpredictable duty cycle is disclosed herein. Moreover, the disclosed circuit can be combined with a frequency divider circuit to provide the dual functions of frequency division and duty cycle control.

The advantages of the disclosed invention over the prior art may be summarized as follows:

(1) less design complexity, as compared to the VCO design requirements of the PLL circuit;

(2) lower power consumption, as compared to the PLL circuit, since no frequency multiplication is required; and (3) improved loop stability, as compared to the prior art circuit of FIG. 2 (U.S. Pat. No. 4,479,216).

The above described embodiments of the invention are intended to be illustrative only. Numerous alternative embodiments may be devised by those skilled in the art without departing from the spirit and scope of the following claims.

We claim:

1. A duty cycle control buffer, comprising:
   an edge detector circuit, for receiving an input clock signal at a frequency f, and for outputting a one shot pulse signal for each transition cycle of said input clock signal, wherein: said one shot pulse signal comprising a pulse train at a frequency equal to f, and with a duty cycle less than 50%,
   a monostable multivibrator circuit, for receiving said one shot pulse signal from said edge detector circuit, and for generating therefrom rectangular output pulse signals having a controllable pulse width, said controllable pulse width being controlled by a feedback circuit element within said monostable multivibrator circuit, wherein said feedback circuit element comprises a CMOS transistor,
   an inverter circuit, for receiving said rectangular output pulse signals from said monostable multivibrator circuit, and for inverting said rectangular output pulse signals, such that the duty cycle of the inverted rectangular output pulse signals is the complement of the duty cycle of said rectangular output pulse signals from said monostable multivibrator circuit,
   an integrator circuit, for receiving said inverted rectangular output pulse signals from said inverter circuit, and for generating an output representing an average voltage of said inverted rectangular output pulse signals,
   an operational amplifier circuit, for receiving the average voltage output from said integrator circuit at one differential input, and for receiving a reference voltage at the other differential input, said operational amplifier outputs a control signal proportional to the difference between said average voltage and the reference voltage,
   wherein said control signal is fed back to said feedback circuit element within said monostable multivibrator circuit for controlling the pulse width of said rectangular pulse output signals.

2. The duty cycle control buffer of claim 1 wherein said feedback circuit element within said monostable multivibrator circuit comprises a PMOS transistor.

3. The duty cycle control buffer of claim 1 wherein said feedback circuit element within said monostable multivibrator circuit comprises an NMOS transistor.

4. The duty cycle control buffer of claim 1 wherein said monostable multivibrator circuit comprises a Schmitt trigger and said feedback circuit element.

5. The duty cycle control buffer of claim 1 wherein said monostable multivibrator circuit comprises an inverter and said feedback circuit element.

6. The duty cycle control buffer of claim 1, further comprising a supply voltage VDD, wherein when said reference voltage is set equal to VDD/2, the duty cycle of said rectangular output pulse signals is equal to 50%.

7. A frequency divider and duty cycle control buffer, comprising:
   a frequency controller circuit, for receiving an input clock signal at a frequency f; and for dividing said input clock signal by a number N, where N is equal to or greater than 1, such that the frequency of a f/N clock signal outputted from said frequency controller circuit is equal to f/N;
   an edge detector circuit, for receiving said f/N clock signal outputted from said frequency controller circuit, and for outputting a one shot pulse signal for one detected edge per cycle of said f/N clock signal,
   a monostable multivibrator circuit, for receiving said one shot pulse signal from said edge detector circuit, and for generating therefrom f/N rectangular output pulse signals having a controllable pulse width, said controllable pulse width being controlled by a feedback circuit element within said monostable multivibrator circuit, wherein said feedback circuit element comprises a CMOS transistor,
   an inverter circuit, for receiving said f/N rectangular output pulse signals from said monostable multivibrator circuit, and for inverting said f/N rectangular output pulse signals, such that the duty cycle of the inverted f/N rectangular output pulse signals is the complement of the duty cycle of said f/N rectangular output pulse signals from said monostable multivibrator circuit,
   an integrator circuit, for receiving said inverted f/N rectangular pulse signals from said inverter circuit, and for generating an output representing an average value of said inverted f/N rectangular output pulse signals,
   an operational amplifier circuit, for receiving said average value output from said integrating circuit at one differential input, and for receiving a reference signal at the other differential input, said operational amplifier outputs a control signal proportional to the difference between said average value and said reference signal.
   wherein said control signal is fed back to said feedback circuit element within said monostable multivibrator circuit for controlling the pulse width of said f/N rectangular output pulse signals.

8. The duty cycle control buffer of claim 7 wherein said feedback circuit element within said monostable multivibrator circuit comprises a PMOS transistor.

9. The duty cycle control buffer of claim 7 wherein said feedback circuit element within said monostable multivibrator circuit comprises an NMOS transistor.

10. The duty cycle control buffer of claim 7 wherein said monostable multivibrator circuit comprises a Schmitt trigger and said feedback circuit element.

11. The duty cycle control buffer of claim 7 wherein said monostable multivibrator circuit comprises an inverter and said feedback circuit element.

12. The duty cycle control buffer of claim 7, further comprising a supply voltage VDD, wherein when said reference voltage is set equal to VDD/2, the duty cycle of said rectangular output pulse signals is equal to 50%.

13. A method of controlling the duty cycle of an unpredictable input clock signal, comprising the steps of:
   a) detecting one transition edge per cycle of said input clock signal,
   b) outputting a single shot pulse corresponding to each detected said transition edge,
   c) generating a rectangular pulse train from the single shot pulse, said rectangular pulse train having a controllable pulse width,
   d) inverting said rectangular pulse train,
   e) deriving an average voltage from the inverted rectangular pulse train,
   f) comparing said average voltage to a predetermined reference voltage,
   g) generating a feedback control signal, via a feedback circuit element, proportional to the difference between said average voltage and said predetermined reference voltage, wherein said feedback circuit element comprises a CMOS transistor, h) controlling said controllable pulse width of said rectangular pulse train by said feedback control signal.

14. A method of dividing the frequency and controlling the duty cycle of an unpredictable input clock signal at a frequency f, comprising the steps of:
 a) dividing the frequency f of said input clock signal by N, where N is a number equal to or greater than 1, and outputting an f/N input clock signal,
 b) detecting one transition edge per cycle of said f/N input clock signal,
 c) outputting a single shot pulse corresponding to each detected said transition edge,
 d) generating a f/N rectangular pulse train from the single shot pulse, said f/N rectangular pulse train having a controllable pulse width,
 e) inverting said f/N rectangular pulse train,
 f) deriving an average voltage from the inverted f/N rectangular pulse train,
 g) comparing said average voltage to a predetermined reference voltage,
 h) generating a feedback control signal, via a feedback circuit element, proportional to the difference between said average voltage and said predetermined reference voltage, wherein said feedback circuit element comprises a CMOS transistor,
 i) controlling said controllable pulse width of said f/N rectangular pulse train by said feedback control signal.

\* \* \* \* \*